(12) United States Patent
Chiang et al.

(10) Patent No.: US 9,196,596 B2
(45) Date of Patent: Nov. 24, 2015

(54) INTERPOSER AND METHOD OF MANUFACTURING THE SAME

(71) Applicant: Siliconware Precision Industries Co., Ltd., Taichung (TW)

(72) Inventors: Ching-Wen Chiang, Taichung (TW); Kuang-Hsin Chen, Taichung (TW); Wei-Jen Chang, Taichung (TW); Hsien-Wen Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/013,469

(22) Filed: Aug. 29, 2013

(65) Prior Publication Data
US 2014/0367849 A1 Dec. 18, 2014

(30) Foreign Application Priority Data

Jun. 18, 2013 (TW) .............................. 102121484 U

(51) Int. Cl.
*H01L 23/00* (2006.01)
(52) U.S. Cl.
CPC ................ *H01L 24/14* (2013.01); *H01L 24/11* (2013.01); *H01L 24/64* (2013.01); *H01L 24/67* (2013.01); *H01L 2924/15788* (2013.01)

(58) Field of Classification Search
CPC ......... H01L 24/10; H01L 24/14; H01L 24/64; H01L 24/67; H01L 14/97
USPC ........................................................... 257/774
See application file for complete search history.

(56) References Cited

U.S. PATENT DOCUMENTS

2004/0023463 A1\* 2/2004 Shirakawa ..................... 438/312
2007/0256858 A1\* 11/2007 Kariya et al. .................. 174/260

\* cited by examiner

*Primary Examiner* — Roy Potter
*Assistant Examiner* — Paul Patton
(74) *Attorney, Agent, or Firm* — Mintz Levin Cohn Ferris Glovsky and Popeo, P.C.; Peter F. Corless; Steven M. Jensen

(57) ABSTRACT

A method of manufacturing an interposer is provided, including forming a plurality of first openings on one surface side of a substrate, forming a first metal layer in the first openings, forming on the other surface side of the substrate a plurality of second openings that are in communication with the first openings, forming a second metal layer in the second openings, and electrically connecting the first metal layer to the second metal layer, so as to form conductive through holes. The conductive through holes are formed stage by stage, such that the fabrication time in forming the metal layers is reduced, and a metal material will not be accumulated too thick on a surface of the substrate. Therefore, the metal material has a smoother surface, and no overburden will be formed around end surfaces of the through holes. An interposer is also provided.

17 Claims, 5 Drawing Sheets

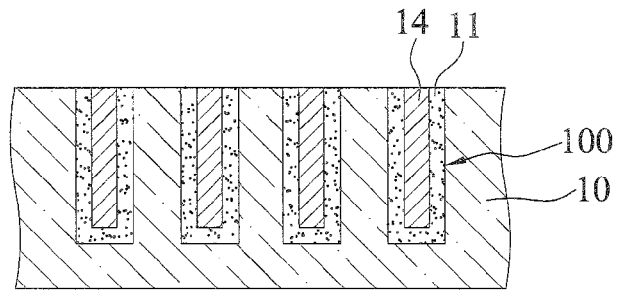
FIG.1A (PRIOR ART)
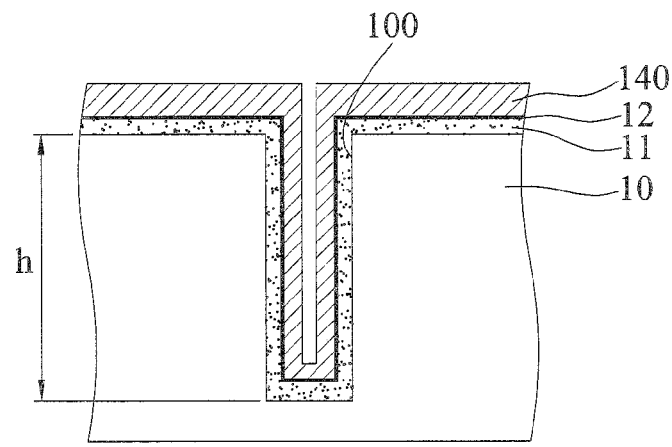
FIG.1A' (PRIOR ART)
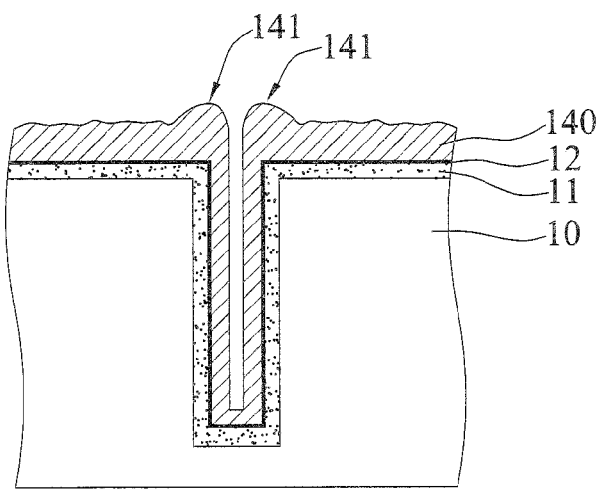
FIG.1A" (PRIOR ART)

INTERPOSER AND METHOD OF MANUFACTURING THE SAME

CROSS-REFERENCES TO RELATED APPLICATIONS

This application claims under 35 U.S.C. §119(a) the benefit of Taiwanese Application No. 102121484, filed Jun. 18, 2013, the entire contents of which is incorporated herein by reference.

BACKGROUND OF THE INVENTION

1. Field of the Invention

This invention relates to interposers, and, more particularly, to an interposer having conductive through holes and a method of manufacturing the interposer.

2. Description of Related Art

In a flip-chip packaging process, since the coefficients of thermal expansion (CTE) of a semiconductor chip and a package substrate differ from each other significantly, bumps around the semiconductor chip cannot be well bonded to corresponding contacts disposed on the package substrate, and the semiconductor chip is thus easily peeling from the package substrate. With the rapid increase of integrity of an integrated circuit, the stress generated by and the warpage occurred on the semiconductor chip and the package substrate are getting worse due to the CTE mismatch of the semiconductor chip and the package substrate. As a result, the reliability of the semiconductor chip and the package substrate becomes worse, and a reliability test often fails.

In order to solve the above problems, a process in which a semiconductor substrate acts as an interposer is brought to the market. In the process, a silicon interposer is disposed between a package substrate and a semiconductor chip. Since the silicon interposer and the semiconductor chip are made of similar materials, the problem occurred due to CTE mismatch is avoided.

FIGS. 1A to 1D are cross sectional views illustrating a method of manufacturing an interposer 1 according to the prior art.

As shown in FIG. 1A, an insulating layer 11 and a plurality of through-silicon vias (TSV) 14 are formed in a silicon substrate 10. As shown in FIG. 1A', the through-silicon vias 14 are formed by forming through holes 100, forming the insulating layer 11 and a conductive layer 12 in the through holes 100 and on the silicon substrate 10, electroplating the conductive layer 12 with a copper layer 140, and removing the copper layer 140 on a surface of the silicon substrate 10, the conductive layer 12 and the insulating layer 11 after the through-silicon vias 14 are formed in the through holes 100.

As shown in FIG. 1B, a first redistribution layer (RDL) 13 is formed on an upper surface side 10a of the silicon substrate 10 and electrically connected to the through-silicon vias 14, for a semiconductor chip (not shown) or a package substrate (not shown) to be mounted thereon.

As shown in FIG. 1C, a lower surface side 10b of the silicon substrate 10 is thinned.

As shown in FIG. 1D, a second redistribution layer (RDL) 16 is formed on the lower surface side 10b of the silicon substrate 10 and electrically connected to the through-silicon vias 14, for a semiconductor chip (not shown) or a package substrate (not shown) to be mounted thereon.

In the method of manufacturing the interposer 1 according to the prior art, the silicon substrate 10 is very thick, and the through holes 100 thus have a great depth h, e.g., 100 to 500 um, and a radius of 100 to 200 um. Therefore, an electroplating process has to be performed in the through holes 100 for a long time, in order for the copper layer 140 to be formed on the hole walls and bottom portions of the through holes 100. Because the electroplating process is performed for a long time, the copper layer 140 formed on a surface of the silicon substrate 10 is very thick, and has a rough surface. As a result, an overburden 141 is likely formed around end surfaces of the through holes, as shown in FIG. 1A".

According to the prior art, a chemical mechanical polishing (CMP) process is used to remove the copper layer 140 on the surface of the silicon substrate 10. However, it is unlikely to remove the copper layer 140 and the overburden 141 completely without the surface of the silicon substrate 10 penetrated, if the copper layer 140 is very thick. Hence, the prior art suffers from a long process time, a high cost of chemical fluid, and a complicated process.

However, how to solve the problems of the prior art is becoming an urgent issue in the art.

SUMMARY OF THE INVENTION

In view of the above-mentioned problems of the prior art, the present invention discloses an interposer, comprising: a substrate having opposing first surface side and second surface side, the substrate having a plurality of first openings on the first surface side and a plurality of second openings on the second surface side, the first openings being in communication with the second openings to form through holes; a first metal layer formed in the first openings; and a second metal layer formed in the second openings and electrically connected to the first metal layer, such that conductive through holes constituted by the first metal layer and the second metal layer are formed in the through holes.

The present invention further discloses a method of manufacturing an interposer, comprising: providing a substrate having opposing first surface side and second surface side; forming a plurality of first openings on the first surface side of the substrate; forming a first metal layer in the first openings; forming a plurality of second openings on the second surface side of the substrate, the first openings being in communication with the second openings to form through holes; and forming a second metal layer in the second openings and electrically connecting the second metal layer to the first metal layer, such that conductive through holes constituted by the first metal layer and the second metal layer are formed in the through holes.

In an embodiment, the substrate is at least made of silicon or a silicon-containing substrate (silicon substrate or a glass substrate).

In an embodiment, the method further comprises forming a first redistribution layer on the first surface side of the substrate and electrically connecting the conductive through holes to the first redistribution layer.

In an embodiment, the method further comprises forming a second redistribution layer on the second surface side of the substrate and electrically connecting the conductive through holes to the second redistribution layer.

In an embodiment, the method further comprises, prior to forming a first metal layer, forming an insulating layer on hole walls of the first openings, such that the first metal layer is formed on the insulating layer. In an embodiment, the method further comprises, prior to forming a first metal layer, forming an etch-stop layer on the insulating layer, such that the etch-stop layer is formed between the insulating layer and the first metal layer. In an embodiment, the method further comprises, prior to forming a second metal, removing the etch-stop layer in the through holes, such that the first metal layer is exposed from the through holes.

In an embodiment, the method further comprises, prior to forming a second metal layer, forming an insulating layer on hole walls of the second openings, such that the second metal layer is formed on the insulating layer.

In an embodiment, the method further comprises, prior to forming a first metal layer, forming conductive bumps in the first openings, such that the first metal layer is formed on the conductive bumps and is electrically to the second metal layer via the conductive bumps.

According to an interposer and a method of manufacturing the interposer according to the present invention, the conductive through holes are formed stage by stage (i.e., first forming the first openings and the first metal layer, and then forming the second openings and the second metal layer), in order to reduce the depth of the through holes and the time for forming the metal layers. Compared to the prior art, a thick metal material will not be accumulated on the first surface side and the second surface side of the substrate, and the metal material has a smoother surface. Further, an overburden will not formed around end surfaces of the through holes. Therefore, the CMP process is omitted, process time is reduced, the cost of chemical fluid is decreased, and the process is simplified.

BRIEF DESCRIPTION OF DRAWINGS

The invention can be more fully understood by reading the following detailed description of the preferred embodiments, with reference made to the accompanying drawings, wherein:

FIGS. 1A to 1D are cross sectional views illustrating a method of manufacturing an interposer according to the prior art;

FIGS. 1A' and 1A" are enlarged views of a portion of FIG. 1A;

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A to 2E are cross sectional views illustrating a method of manufacturing an interposer 2 according to the present invention.

Figure 1B:
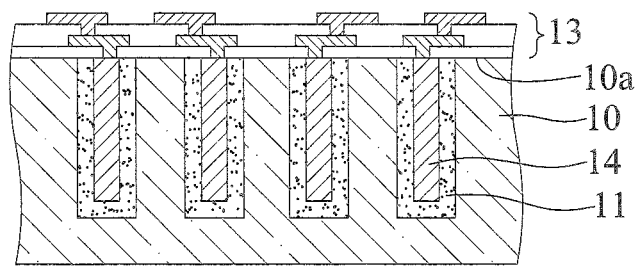
Figure 1C:
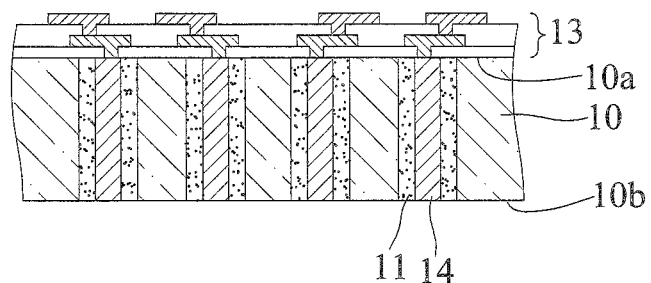
Figure 1D:
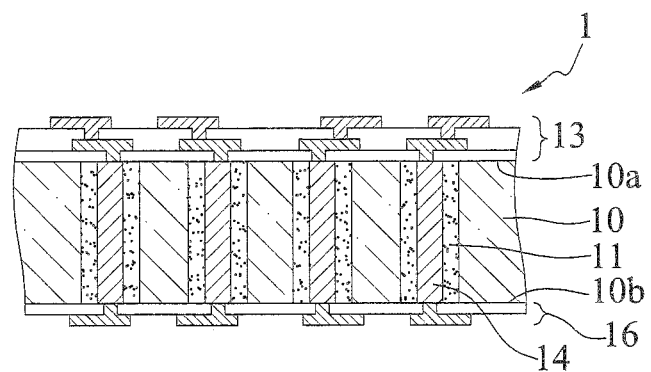
Figure 2A:
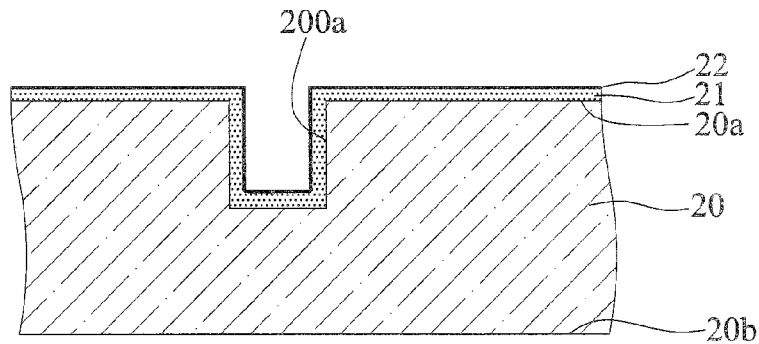
FIGS. 2A to 2E are cross sectional views illustrating a method of manufacturing an interposer according to the present invention.

As shown in FIG. 2A, a substrate 20 having opposing first surface side 20a and second surface side 20b is provided, a plurality of first openings 200a are formed on the first surface side 20a of the substrate 20, and an insulating layer 21 is formed on hole walls of the first openings 200a and the first surface side 20a of the substrate 20. An etch-stop layer 22 is then formed on the insulating layer 21.

In an embodiment, the substrate 20 is at least made of silicon or a silicon-containing substrate (e.g., a silicon substrate or a glass substrate), and the insulating layer 21 is made of thermal oxide and acts as a stress buffer layer.

In an embodiment, the etch-stop layer 22 is made of silicon nitride, for an etch fluid to be highly selective etching between a silicon material and the silicon nitride.

In an embodiment, the insulating layer 21 is formed by an annealed chemical vapor deposition (CVD) oxide material.

In an embodiment, if the substrate 20 is a glass substrate, the insulating layer 21 is omitted.

Figure 2B:
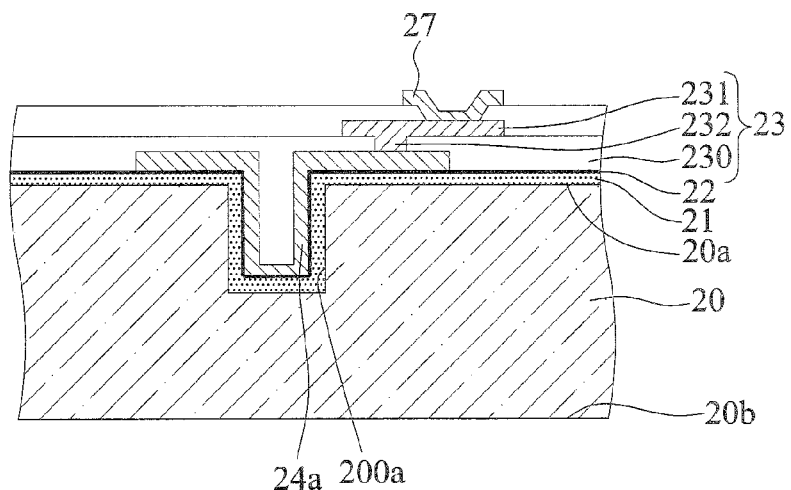

As shown in FIG. 2B, a first redistribution layer 23 is formed on the etch-stop layer 22 on the first surface side 20a of the substrate 20, and a first metal layer 24a is formed on the etch-stop layer 22 in the first openings 200a.

In an embodiment, the first redistribution layer 23 has at least one dielectric layer 230, a circuit layer 231 formed on the dielectric layer 230, and conductive blind vias 232 disposed in the dielectric layer 230 and electrically connected to the circuit layer 231.

In an embodiment, the first metal layer 24a and the circuit layer 231 are made of copper, and the dielectric layer 230 is made of polyimide (PI), a dry film, epoxy resin or a packaging material.

In an embodiment, the bottommost one of the dielectric layer 230 is a protection material copper, to prevent foreign matters from entering the first openings 200a and affecting the electrical quality of the first metal layer 24a.

In an embodiment, before the first metal layer 24a and the bottommost circuit layer 231 of the first redistribution layer 23 are formed a barrier layer (not shown) is formed on the etch-stop layer 22, and a conductive layer (not shown) is then formed on the barrier layer by a physical vapor deposition (PVD) process.

In an embodiment, the barrier layer is made of Ti, TiN, Ta or TaN, which improve the bondage of the metal material.

In an embodiment, the conductive layer is made of copper, and is used as a seed layer for electroplating the first metal layer 24a and the circuit layer 231.

In the electroplating process according to the present invention, since the depth of the first openings 200a is smaller than that of the through holes of the prior art less fabrication time is needed to electroplate the first metal layer 24a. As a result, the metal layer formed on the substrate 20 is not very thick and has a smoother surface, and therefore no overburden is formed.

Figure 2C:
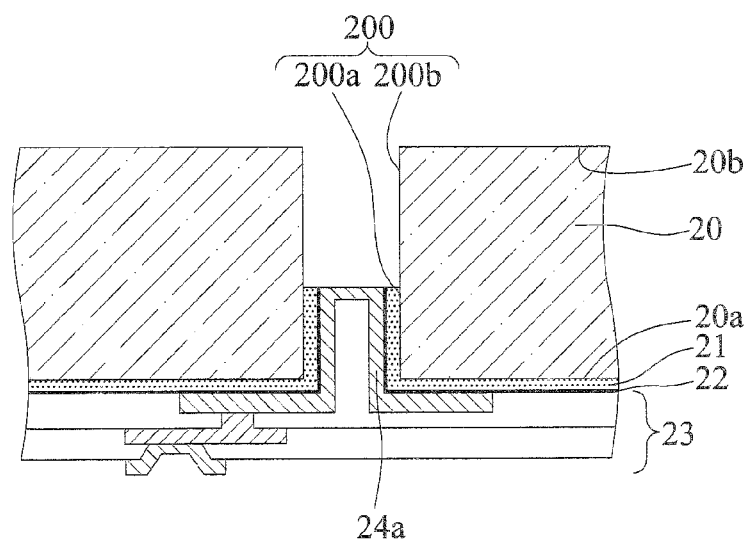

As shown in FIG. 2C, a plurality of second openings 200b are formed on the second surface side 20b of the substrate 20, and the first openings 200a are in communication with the second openings 200b correspondingly to form a plurality of through holes 200.

In an embodiment, the second openings 200b are formed by an etch process.

Figure 2D:
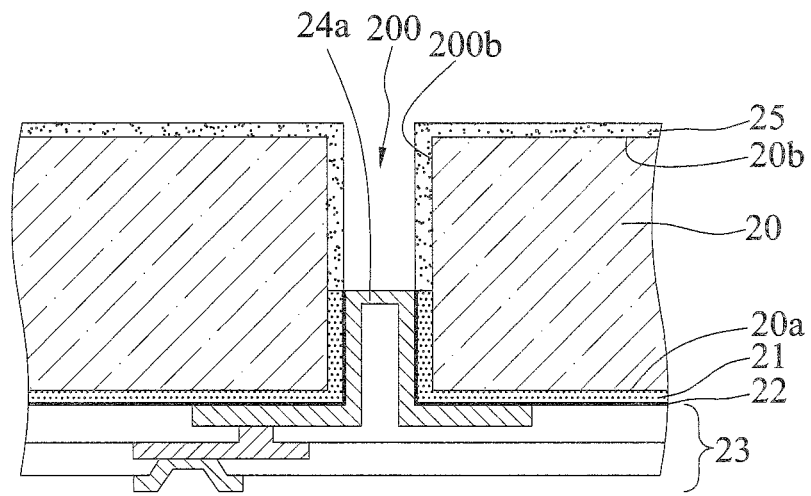

As shown in FIG. 2D, the etch-stop layer 22 in the through holes 200 (i.e., the etch-stop layer 22 in the second openings 200b) is removed, to expose the first metal layer 24a from the through holes 200. Another insulating layer 25 is then formed on hole walls of the second openings 200b and the second surface side 20b of the substrate 20.

In an embodiment, the insulating layer 25 is made of thermal oxide or annealed CVD oxide material, and acts as a stress buffer layer.

In an embodiment, if the substrate 20 is a glass substrate, the insulating layer 25 is omitted.

In an embodiment, the depth of the through holes 200 is about 100 to 500 um, and the depths of the first openings 200a and the second openings 200b are less than the depth of the through holes 200.

Figure 2E:
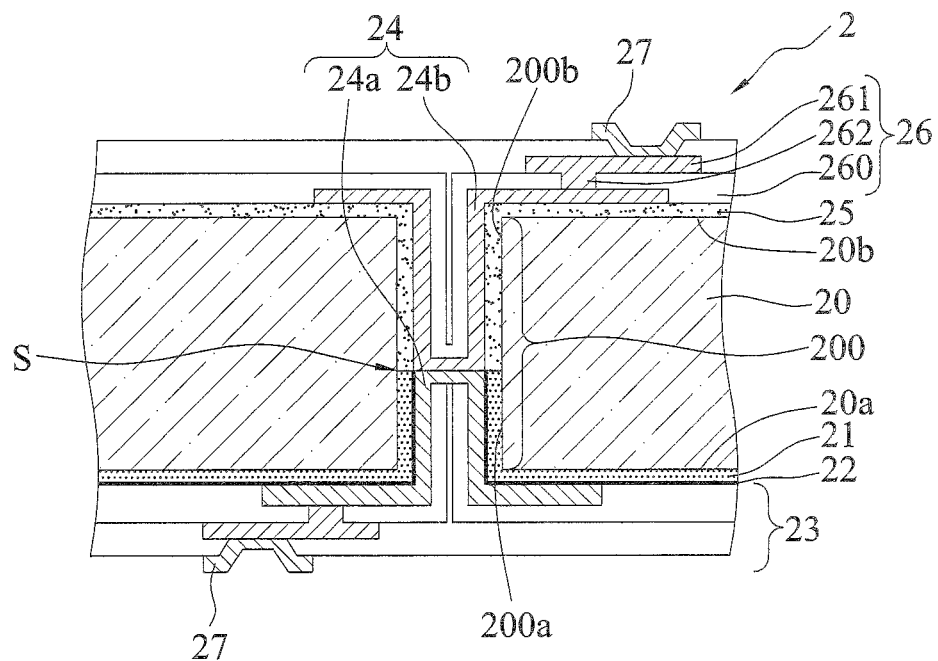

As shown in FIG. 2E, a second redistribution layer 26 is formed on the insulating layer 25 on the second surface side 20b of the substrate 20, a second metal layer 24b is formed on the insulating layer 25 in the second openings 200b, and the first metal layer 24a is in contact with and electrically connected to the second metal layer 24b, such that a metal structure in the through holes 200 forms conductive through holes 24 and the conductive through holes 24 are electrically connected to the first redistribution layer 23 and the second redistribution layer 26.

In an embodiment, the second redistribution layer 26 has at least one dielectric layer 260 formed on the circuit layer 261 on the dielectric layer 260 and in the dielectric layer 260 and electrically connected to the conductive vias 262 of the circuit layer 261.

In an embodiment, the first metal layer 24a and the second metal layer 24b are made of the same or different material, and an interface S is formed between the first metal layer 24a and the second metal layer 24b since the first metal layer 24a and the second metal layer 24b are formed by different process steps.

In an embodiment, the circuit layer 261 is made of copper, the dielectric layer 260 is made of polyimide (PI), a dry film, epoxy resin or a packaging material, and the bottommost one of the dielectric layer 260 is a protection copper material, in order to prevent foreign matters from entering the second openings 200b and affecting the electrical quality of the second metal layer 24b.

In an embodiment, before the bottommost circuit layer 261 of the second redistribution layer 26 and the second metal layer 24b are formed, a barrier layer (not shown) can be formed on the insulating layer 25, and a conductive layer (not shown) can then be formed on the barrier layer by a PVD process.

In an embodiment, the barrier layer is made of Ti, TiN, Ta or TaN, to improve the bondage of a metal material.

In an embodiment, the conductive layer is made of copper, and acts as a seed layer for electroplating the second metal layer 24b and the circuit layer 261.

In a method of manufacturing an interposer according to the present invention, the first openings 200a and the second openings 200b are formed subsequently on the first surface side 20a and the second surface side 20b of the substrate 20, respectively, and have opening depths reduced significantly. A electroplating process is performed in the first openings 200a and the second openings 200b subsequently. As a result, the first metal layer 24a is formed to cover the hole walls and the bottom portion of the first openings 200a, and the second metal layer 24b is formed to cover the hole walls and the bottom portion of the second openings 200b. Therefore, it does not take long time to perform the electroplating process.

Compared with the prior art, the metal material on the first surface side 20a and the second surface side 20b of the substrate 20 is thinner and has a smoother surface, and no overburden will be formed around end surfaces of the through holes 200. Therefore, the CMP process is omitted, the process time is reduced, the cost of chemical fluid is decreased, and the process is simplified.

Figure 3A:
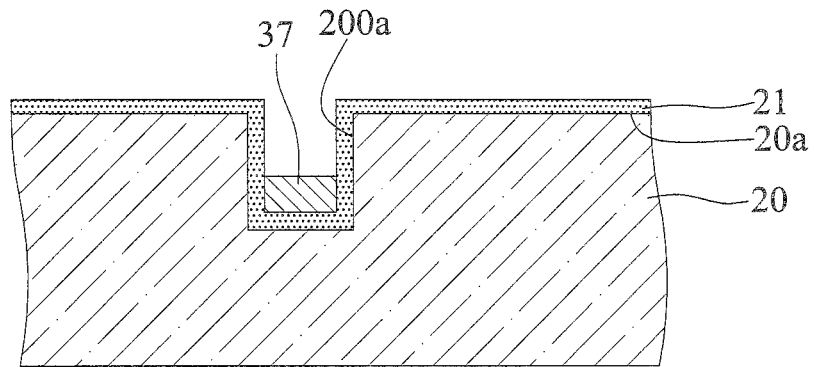
FIGS. 3A and 3B are cross sectional views illustrating another method of manufacturing an interposer according to the present invention.
Figure 3B:
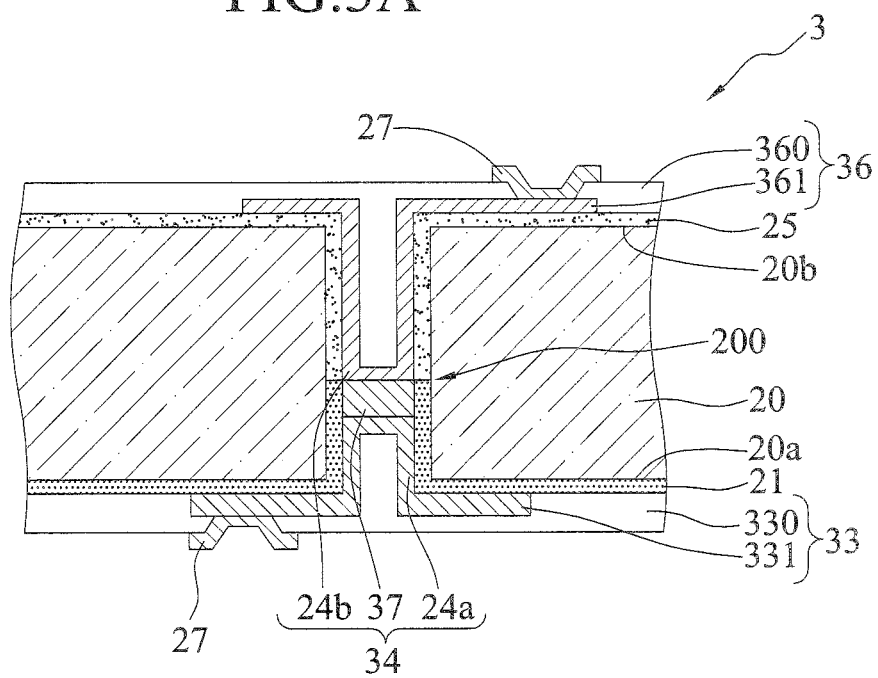

FIGS. 3A and 3B are cross sectional views illustrating another method of manufacturing an interposer 3 according to the present invention.

As shown in FIG. 3A, an insulating layer 21 is formed on the substrate 20 shown in FIG. 2A first, and then conductive bumps 37 are disposed in the first openings 200a.

As shown in FIG. 3B, subsequent to the process steps shown in FIGs. from 2B to 2E, the first metal layer 24a is formed on the conductive bumps 37, the conductive bumps 37 are exposed from the through holes 200 when the second openings 200b are formed, and the first metal layer 24a is electrically connected to the second metal layer 24b via the conductive bumps 37.

In an embodiment, the conductive through holes 34 comprise the first metal layer 24a, the conductive bumps 37 and the second metal layer 24b.

In an embodiment, the first redistribution layer 33 has a dielectric layer 330 and a circuit layer 331 formed on the dielectric layer 330, and the second redistribution layer 36 has a dielectric layer 360 and a circuit layer 361 formed on the dielectric layer 360.

In an embodiment, since the conductive bumps 37 are disposed in the through holes 200, the connection strength between the first metal layer 24a and the second metal layer 24b is enhanced, which also acts as an etch-stop layer.

In an embodiment, the bottommost circuit layer 231, 331 of the first redistribution layer 23, 33 and the first metal layer 24a can be formed simultaneously or formed individually. Similarly, the bottommost circuit layer 261, 361 of the second redistribution layer 26, 36 and the second metal layer 24b can be formed simultaneously or formed individually.

In an embodiment, under bump metallurgy (UBM) 27 can be disposed on the outermost circuit layer 231, 331 of the first redistribution layer 23, 33 and the outermost circuit layer 261, 361 of the second redistribution layer 26, 36 on demands.

The present invention also provides an interposer 2, 3, comprising a substrate 20, a first metal layer 24a and a second metal layer 24b.

The substrate 20 comprises opposing first surface side 20a and second surface side 20b. A plurality of first openings 200a are formed on the first surface side 20a of the substrate 20. A plurality of second openings 200b are formed on the second surface side 20b of the substrate 20. The first openings 200a are in communication with the second openings 200b correspondingly to form a plurality of through holes 200. In an embodiment, the substrate 20 is at least made of silicon or a silicon-containing substrate (e.g., a silicon substrate or a glass substrate).

The first metal layer 24a is formed in the first openings 200a.

The second metal layer 24b is formed in the second openings 200b. The first metal layer 24a is electrically connected to the second metal layer 24b. Conductive through holes 24, 34 are formed in the through holes 200.

In an embodiment, the interposer 2, 3 further comprises a first redistribution layer 23, 33 formed on the first surface side 20a of the substrate 20 and electrically connected to the conductive through holes 24, 34.

In an embodiment, the interposer 2, 3 further comprises a second redistribution layer 26, 36 formed on the second surface side 20b of the substrate 20 and electrically connected to the conductive through holes 24, 34.

In an embodiment, the interposer 2, 3 further comprises an insulating layer 21, 25 formed between the first surface side 20a of the substrate 20 and the first redistribution layer 23, 33, between the first metal layer 24a and the hole walls of the first openings 200a, between the second surface side 20b of the substrate 20 and the second redistribution layer 26, 36, and between the second metal layer 24b and the hole walls of the second openings 200b. The interposer 2 comprises an etch-stop layer 22 formed between the insulating layer 21 and the first metal layer 24a and between the insulating layer 21 and the first redistribution layer 23.

In an embodiment, the interposer 3 further comprises a plurality of conductive bumps 37 disposed in the through holes 200 and disposed between the first metal layer 24a and the second metal layer 24b. The first metal layer 24a is electrically connected to the second metal layer 24b via the conductive bumps 37.

According to an interposer and a method of manufacturing the interposer according to the present invention, the conductive through holes are formed stage by stage, in order to reduce the depth of the through holes and the time for forming the metal layers. Compared to the prior art, a metal material will not be accumulated too thick on the first surface side and the second surface side of the substrate, and the metal material has a smoother surface. Further, an overburden will not formed around end surfaces of the through holes. Therefore, the CMP process is omitted, process time is reduced, the cost of chemical fluid is decreased, and the process is simplified.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. An interposer, comprising:
a substrate having opposing first surface side and second surface side, the substrate having a plurality of first openings on the first surface side and a plurality of second openings on the second surface side, the first openings being in communication with the second openings to form through holes;
an etch-stop layer formed on hole walls of the first openings;
a first metal layer formed in the first openings, wherein the etch-stop layer is formed between the hole walls of the first openings and the first metal layer; and
a second metal layer formed in the second openings and electrically connected to the first metal layer, such that conductive through holes constituted by the first metal layer and the second metal layer are formed in the through holes, wherein the first metal layer and the second metal layer are separated by an interface therebetween.

2. The interposer of claim 1, wherein the substrate is at least made of silicon.

3. The interposer of claim 1, further comprising a first redistribution layer disposed on the first surface side of the substrate and electrically connected to the conductive through holes.

4. The interposer of claim 1, further comprising a second redistribution layer disposed on the second surface side of the substrate and electrically connected to the conductive through holes.

5. The interposer of claim 1, further comprising an insulating layer formed between the hole walls of the first openings and the first metal layer, and between hole walls of the second openings and the second metal layer, wherein the etch-stop layer is formed between the insulating layer and the first metal layer.

6. The interposer of claim 1, further comprising a plurality of conductive bumps disposed in the through holes and between the first metal layer and the second metal layer.

7. The interposer of claim 6, wherein the first metal layer is electrically connected to the second metal layer via the conductive bumps.

8. A method of manufacturing an interposer, comprising:
providing a substrate having opposing first surface side and second surface side;
forming a plurality of first openings on the first surface side of the substrate;
forming a first metal layer in the first openings;
forming a plurality of second openings on the second surface side of the substrate, the first openings being in communication with the second openings to form through holes; and
forming a second metal layer in the second openings and electrically connecting the second metal layer to the first metal layer, such that conductive through holes constituted by the first metal layer and the second metal layer are formed in the through holes.

9. The method of claim 8, wherein the substrate is at least made of silicon.

10. The method of claim 8, further comprising forming a first redistribution layer on the first surface side of the substrate and electrically connecting the conductive through holes to the first redistribution layer.

11. The method of claim 8, further comprising forming a second redistribution layer on the second surface side of the substrate and electrically connecting the conductive through holes to the second redistribution layer.

12. The method of claim 8, further comprising, prior to forming a first metal layer in the first openings, forming an insulating layer on hole walls of the first openings, such that the first metal layer is formed on the insulating layer.

13. The method of claim 12, further comprising forming an etch-stop layer on the insulating layer, such that the first metal layer is formed on the etch-stop layer.

14. The method of claim 13, further comprising, prior to forming a second metal layer, removing the etch-stop layer in the through holes, to expose the first metal layer from the through holes.

15. The method of claim 8, further comprising, prior to forming a second metal layer, forming an insulating layer on hole walls of the second openings, such that the second metal layer is formed on the insulating layer.

16. The method of claim 8, further comprising forming conductive bumps in the first openings, such that the first metal layer is formed on the conductive bumps.

17. The method of claim 16, wherein the first metal layer is electrically connected to the second metal layer via the conductive bumps.

* * * * *